United States Patent [19]

Boudouris et al.

[11] 4,206,415
[45] Jun. 3, 1980

[54] AUDIO AMPLITUDE DETECTOR CIRCUIT

[75] Inventors: Angelo Boudouris, Sylvania, Ohio; Edwin F. Peters, Lambertville, Mich.

[73] Assignee: Eprad Incorporated, Toledo, Ohio

[21] Appl. No.: 929,507

[22] Filed: Jul. 31, 1978

[51] Int. Cl.² ............................................. H03G 7/00
[52] U.S. Cl. ...................................... 330/59; 330/138; 330/144; 330/280; 330/284
[58] Field of Search .................. 330/59, 138, 144, 145, 330/280, 284, 308

[56] References Cited

U.S. PATENT DOCUMENTS

| | | | |
|---|---|---|---|
| 3,333,208 | 7/1967 | Hudak | 330/59 |
| 3,436,674 | 4/1969 | Alexandrovich et al. | 330/59 |
| 3,978,423 | 8/1976 | Bench | 330/59 X |

Primary Examiner—James B. Mullins
Attorney, Agent, or Firm—Oliver E. Todd, Jr.

[57] ABSTRACT

An audio signal amplitude detector for applying stereo audio signals above a predetermined amplitude to at least one pair of speakers. The audio signal for each channel is amplified and compared with two reference voltages. When the amplified audio signal is below a lower one of the reference voltages, the signal is blocked to the connected speaker amplifier. As the amplitude of the audio signal increases between the first and second reference voltages, an increasing portion of the audio signal is applied to the connected speaker amplifier until a maximum signal is applied when the amplitude is above the second reference voltage.

4 Claims, 1 Drawing Figure

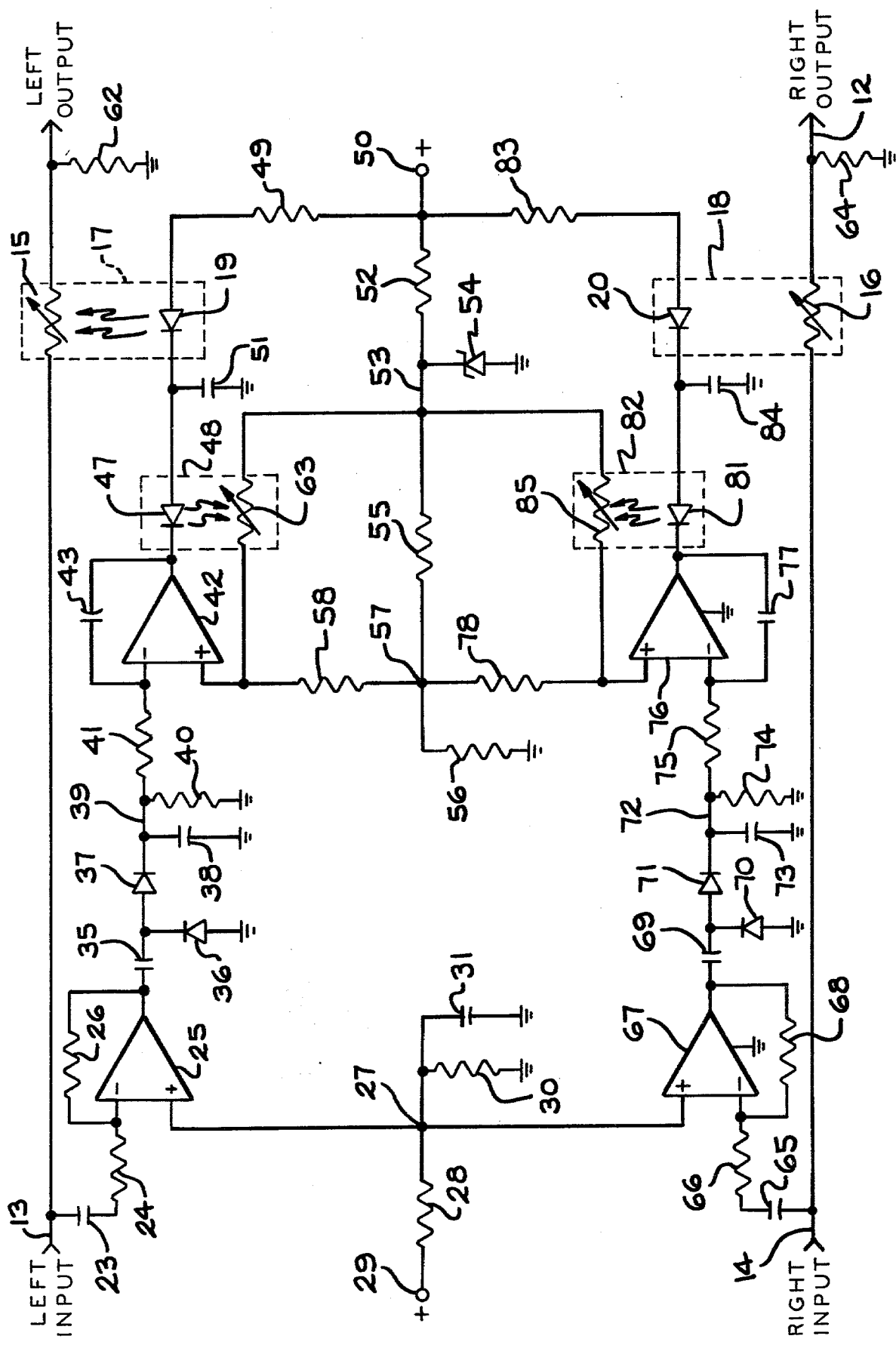

AUDIO AMPLITUDE DETECTOR CIRCUIT

BACKGROUND OF THE INVENTION

This invention relates to audio signal control circuitry and more particularly to an audio signal amplitude detector for applying an audio signal above a predetermined amplitude to a speaker.

Motion picture theaters are often equipped with a stereo sound system having several pairs of speakers. At least one pair of speakers is located at the front of the theater on either side of the audience. A second pair of speakers is commonly located at the rear of the theater, again on either side of the audience. Under most circumstances, for example, when an actor or actress is talking, the audience is most comfortable when the sound comes only from the front pair of speakers so that the sound appears to come from the picture! It is dramatically effective to drive the rear pair of speakers for special effects such as explosions, loud noises and climaxes in the background music. One method for accomplishing this is to monitor the amplitude of the signal applied to the front pair of speakers and to close relays for connecting the rear pair of speakers to the sound system when the monitored amplitude exceeds a predetermined level. However, this arrangement produces an undesirably loud pop or click in the rear speakers when the relay is closed.

SUMMARY OF THE INVENTION

According to the present invention, an electronic amplitude detector circuit is provided for applying audio signals above a predetermined low magnitude to an output circuit, such as a speaker amplifier. The portion of the audio signal applied to the output increases as the amplitude of the audio signal increases from the predetermined low amplitude to a predetermined higher amplitude. A variable resistance or other output device in an optical coupler is connected in series between the audio signal source and the output which is typically connected to a speaker amplifier. The variable resistance, which may comprise a phototransistor, will normally have a near infinite resistance which decreases to a very low resistance as the variable resistor is excited by a light emitting diode (LED). The audio signal is sampled and compared with a reference voltage. The results of the comparison drive the LED to control the portion of the audio signal applied to the output. Initially, the reference voltage is at a predetermined low level, such as approximately 6 volts. When an amplified and detected sample of the audio signal is below the reference voltage, the variable resistance in the optical coupler is unexcited and, therefore, inhibits an output. As the amplified and detected sample of the audio signal increases from the low reference voltage to a higher reference voltage, such as 12 volts, the variable resistance is increasingly excited by the LED to pass an increasing portion of the audio signal to the output. Above the higher reference voltage, the entire audio signal is passed to the output. In a stereo system such as is found in a motion picture theater, identical circuitry is provided for sampling and comparing the audio signals in each channel for separately controlling each channel. Since the variable resistance in series in each audio channel between the source and the output is gradually changed, there are no sudden noises in the speakers when the rear speakers in a motion picture theater are energized for reproducing higher amplitude audio signals.

Accordingly, it is an object of the invention to provide an improved amplitude detector circuit for applying an audio signal above a predetermined magnitude to an output.

Another object of the invention is to provide an improved amplitude detector circuit for controlling a pair of speakers in a stereo sound system.

Other objects and advantages of the invention will become apparent from the following detailed description, with reference being made to the accompanying drawing.

BRIEF DESCRIPTION OF THE DRAWING

The single FIGURE is a schematic circuit diagram of an audio signal amplitude detector circuit constructed in accordance with the present invention.

DESCRIPTION OF THE PREFERRED EMBODIMENT

Turning now to the drawing, a schematic circuit diagram is shown for an audio signal amplitude detector circuit 10 constructed in accordance with the present invention for use with a stereo sound system. The circuit 10 is particularly useful for controlling the application of higher audio signals to a rear pair of speakers (not shown) in a motion picture theater. An output 11 applies a controlled audio signal to a left rear speaker and an output 12 applies a controlled audio signal to a right rear speaker. Normally, left and right channel audio signals picked up from a sound track on a motion picture film are amplified and applied to at least a front pair of speakers in a movie theater. Sound information for a rear channel also may come from the difference between left and right front channel information. It should be appreciated that the sound or audio signals may come fron other sources such as a synthesizer which generates desired sound effects. The audio signal for the left channel is applied from the signal source to a left input 13 and the audio signal for the right channel is applied from the signal source to a right input 14.

The left input 13 is connected through a light sensitive variable resistance 15 to the left output 11 and the right input 14 is connected through a light sensitive variable resistance 16 to the right output 12. The variable resistances 15 and 16 are the output or driven elements of optical couplers 17 and 18, respectively, and, for example, may comprise phototransistors. The optical coupler 17 includes a drive element, such as an LED 19 or other suitable light source, which is mounted to illuminate the variable resistance 15. As the light intensity of the LED 19 increases, the effective resistance of the variable resistance 15 drops substantially from an open circuit to a relatively low value, for example, about 200 ohms. The actual resistance value of the variable resistance 15 depends upon the light output from the LED 19 which in turn is dependent upon the current through the LED 19. Similarly, the optical coupler 18 includes an LED 20 which is mounted to excite or illuminate the variable resistance 16 for controlling the effective resistance of the variable resistance 16.

The value of the variable resistance 15 in series in the left channel is controlled in response to the amplitude of the audio signal applied to the left input 13. A capacitor 23 samples the audio signal on the left input 13 and applies the sample through a series resistor 24 to the negative or inverting input of an operational amplifier 25. A negative feedback resistor 26 is connected between the output of the operational amplifier 25 and the negative input, and the positive input to the operational amplifier 25 is connected to a junction 27. The junction 27 is connected through the resistor 28 and a positive terminal 29 to a positive voltage source (not shown) and through a resistor 30 and a parallel capacitor 31 to ground. The resistors 28 and 30 form a voltage divider which determines the voltage on the junction 27 while the capacitor 31 shunts to ground any AC signal appearing on the junction 27. The operational amplifier 25 has a gain which is controlled by the ratio of the resistors 26 and 24.

The output from the operational amplifier 25 is applied to a voltage doubler, rectification and filter circuit which includes a capacitor 35, two diode rectifiers 36 and 37 and a capacitor 38. The rectified and doubled output from the amplifier 25 appears on a junction 39. The capacitor 38 and a resistor 40 are connected in parallel from the junction 39 to ground. The DC voltage appearing on the junction is proportional to the average peak amplitude of the audio signal applied to the left input 13. The DC voltage appearing on the junction 39 is applied through a resistor 41 to an integrater which includes an operational amplifier 42 and a negative feedback capacitor 43.

The output from the operation amplifier 42 is applied in series through an LED 47 in an optical coupler 48, the LED 19 and the optical coupler 17 and a resistor 49 to a positive terminal 50 which is connected to a suitable power supply (not shown). The terminals 29 and 50 may be connected to the same power supply. A capacitor 51 is connected from between the LEDs 47 and 19 to ground to speed up the reaction of the coupler 48 to changes in the output from the operational amplifier 42. The current flowing between the output of the operational amplifier 42 and the positive terminal 50 excites the LED 19 for controlling effective resistance of the variable resistance 15 connected between the left channel input 13 and the left channel output 11. This current is determined by the relative magnitudes of the positive and negative inputs to the operational amplifier 42. As previously indicated, both the negative feedback capacitor 43 and the voltage on the junction 39 which is proportional to the amplitude of the audio signal on the left channel input 13 are applied to the negative input of the operational amplifier 42. A reference voltage is applied to the positive input of the operational amplifier 42 which varies between a low and high level, e.g., between 6 volts and 12 volts, depending upon the magnitude of the negative input to the operational amplifier 42. The positive terminal 50 is connected through a resistor 52 to a junction 53 which in turn is connected through a Zener diode 54 to ground. The Zener diode 54 establishes a voltage on the junction 53 which is the highest reference voltage applied to the positive input of the amplifier 42. A pair of resistors 55 and 56 are connected in series between the junction 53 and ground to form a voltage divider establishing a predetermined lower reference voltage on a junction 57. The junction 57 is connected through a resistor 58 to the positive input of the amplifier 42.

For the following discussion, it will be assumed that the Zener diode 54 establishes a voltage of 12 volts on the junction 53 and that the resistors 55 and 56 are identical so as to maintain the junction 57 at 6 volts. As a consequence, 6 volts is applied through the resistor 58 to the positive input of the amplifier 42. As long as the amplitude of the audio signal in the left channel applied to the left input 13 is such that the voltage appearing on the negative input to the amplifier 42 is equal to or less than 6 volts, no current will flow from the output of the amplifier 42 through the series LEDs 47 and 19 and the resistor 49. As the voltage on the negative input to the amplifier 42 gradually increases above 6 volts due to an increase in the amplitude of the left channel audio signal, current will begin to flow through the LEDs 47 and 19. This current causes the LED 19 to emit light which in turn causes a decrease in the effective resistance of the variable resistance 15. As a consequence, the left channel audio signal applied to the left input 13 is applied through the resistance 15 to the left channel output 11. A resistor 62 is connected from the left channel output 11 to ground. The variable resistance 15 and the resistor 62 form a voltage divider. As long as the value of the resistance 15 is appreciably above the value of the resistor 62, very little of the audio signal will appear on the left channel output 11. As the value of the variable resistance 15 decreases and eventually becomes small compared to the resistor 62, an increasing portion of the audio signal will appear on the left channel output 11.

The current flowing through the LED 19 and the optical coupler 17 also flows through the LED 47 and the optical coupler 48 for controlling the effective resistance of a variable resistance 63. The variable resistance 63 is connected from the 12 volt junction 53 to the positive input of the amplifier 42. As a consequence, the voltage on the positive input of the amplifier 42 will gradually increase from 6 volts to 12 volts as the signal on the negative input to the amplifier 42 also increases from 6 volts to 12 volts. Preferably, the optical couplers 17 and 48 are closely matches so that the variable resistances 15 and 63 are identical in value for a given current through the LEDs 19 and 47 to maintain a linear increase in the portion of the left channel audio signal applied to the left output 11 as the amplitude of the audio signal linearly increases above the predetermined low level. This insures a smooth transition from off to a gain of one in the left audio channel.

The right channel functions in an identical manner to the left channel with the right input 14 applied through the variable resistance 16 in the optical coupler 18 to the right output 12. The right output 12 is also connected through a fixed resistor 64 to ground. When the amplitude of the right channel audio signal is low, the variable resistance 16 is appreciably higher than the resistor 64 to inhibit outputs of the right channel audio signal. At high amplitudes, the value of the variable resistance 16 is appreciably lower than the resistor 64 and substantially all of the right channel audio signal will appear on the right output 12.

A sample of the audio signal on the right channel input 14 is supplied through a capacitor 65 in a series input resistor 66 to the negative or inverting input of an operational amplifier 67. The operational amplifier 67 has a negative feedback resistor 68 connected between the output and the negative input, and also has a positive input connected to the junction 27 along with the positive input of the operational amplifier 25 in the left channel. The output from the operational amplifier 67 is applied to a capacitor 69 which in turn is connected through a diode rectifier 70 to ground and through a diode rectifier 71 to a junction 72. The junction 72 is connected through a parallel capacitor 73 and resistor 74 ground and through an input resistor 75 to an operational amplifier 76. The operational amplifier 76 has a negative feedback capacitor 77 which causes the operational amplifier 76 to function as an integrater. A positive input to operational amplifier 76 is connected through a resistor 78 to the junction 57 which is maintained at the predetermined low reference voltage level which previously was assumed to be 6 volts DC.

The output of the operational amplifier 76 is connected through an LED 81 in an optical coupler 82, the LED 20 and the optical coupler 18 and a resistor 83 to the positive terminal 50. A capacitor 84 is connected between the LEDs 81 and 20 to ground to speed up the reaction time of the coupler 82. The optical coupler 82 has a variable output resistance 85 which is connected between the junction 53 and the positive input of the operational amplifier 76. As the output current from the operational amplifier 76 through the LED 81 increases, the value of the variable resistance 85 decreases to in turn increase the voltage on the positive input to the amplifier 76.

As with the left channel, the right channel will have no output when the signal applied to the negative input of the amplifier 76 is below the lower reference voltage on the junction 57. As the amplitude of the audio signal in the right channel increases between the low reference voltage on the junction 57 and the higher reference voltage on the junction 53, an increasing portion of the audio signal will be applied from the right channel input to the right channel output 12. In order to establish linearity in this increase and therefore a smooth transition from off to a gain of one in the right channel, the optical couplers 18 and 82 should be matched. When the signal on the negative input to the amplifier 76 is equal to or above the higher reference voltage on the junction 53, substantially all of the right channel audio signal will pass from the right input 14 to the right output 12.

It should be noted that the circuit 10 may be modified so as to be frequency sensitive. It may, for example, be desirable to apply the audio signals to the rear speakers only when low frequencies of a predetermined magnitude are present. This may be accomplished by placing capacitors (not shown) in parallel with the negative feedback resistors 26 and 68. The amplifiers 25 and 67 will then function only at lower frequencies which are not passed through the capacitors. At higher frequencies, the capacitors will act as substantially a short circuit. As a consequence, the amplifiers 25 and 67 would not be responsive to these higher frequencies. Other means also may be used for controlling the frequency response of the circuit 10, when desired.

By using the above described circuit 10 for controlling a rear pair of stereo speakers in a motion picture theater, only the rear speakers are controlled while the front pair of speakers are constantly driven. The rear speakers may be turned completely off while the front speakers remain on and, as the rear speakers are turned on or energized, there is no loud click or noise. Of course, other applications of the circuit 10 will be apparent to those skilled in the art.

It will also be appreciated that various modifications and changes may be made in the above described circuit 10 without departing from the claimed invention. For example, the optical couplers 17, 18, 48 and 82 were shown as containing LEDs and variable resistances. The LEDs may be replaced with other known light sources and the variable resistances only represent the function of the driven element in the couplers. The variable resistances may be any known element responsive to a coupled drive. For example, the variable resistances may comprise phototransistors or photocells. The circuit 10 also can be modified so that both left and right channels are controlled in response to the highest amplitude input signal. This can be accomplished by connecting the drive element of a fifth optical coupler in series with the LEDs 19 and 47 and the driven element in parallel with the variable resistance 16 of the coupler 18. The drive element of a sixth optical coupler is connected in series with the LEDs 20 and 81 and the driven element is connected in parallel with the variable resitance 15 of the optical coupler 17. If either channel has a high amplitude input, then both channels will be connected to their respective outputs. This will result in a stereo output even though one channel has a signal above the predetermined minimum amplitude and the other channel has a signal below the predetermined amplitude.

What we claim is:

1. An audio amplitude detector circuit comprising an audio input and an audio output, indirect coupling means having a light emitting drive element and a driven element responsive to said drive element, said driven element comprising a light responsive resistor means connected between said audio input and said audio output, means for detecting the amplitude of an audio signal applied to said audio input, and driving means responsive to said detected amplitude exceeding a predetermined high level for applying a maximum drive signal to said drive element, said driving means decreasing said drive signal from said maximum to a minimum as said detected amplitude drops from said predetermined high level to a predetermined low level, said driven element having a low resistance in response to light emitted from said drive element for applying the audio signal on said input to said audio output when said drive signal is maximum and having an increasing resistance for decreasing the audio signal applied to said audio output as said drive signal decreases to said minimum.

2. An audio amplitude detector circuit comprising an audio input and an audio output, indirect coupling means having a light emitting diode drive element and a driven element responsive to light emitted from said drive element, said driven element connecting said audio input to said audio output, means for detecting the amplitude of an audio signal applied to said audio input, and driving means responsive to said detected amplitude exceeding a predetermined high level for applying a maximum drive signal to said drive element, said driving means decreasing said drive signal from said maximum to a minimum as said detected amplitude drops from said predetermined high level to a predetermined low level, said driven element having means responsive to said drive element for applying the audio signal on said input to said audio output when said drive signal is maximum and for decreasing the audio signal applied to said audio output as said drive signal decreases to said minimum, and wherein said amplitude detecting means includes means for generating a DC voltage proportional to the amplitude of the audio signal, and wherein said means responsive to said detected signal includes an operational amplifier having positive and negative inputs and an output, a negative feedback capacitor connected between said negative input and said output of said amplifier, means applying said DC voltage to said negative input, means for applying a DC reference voltage to said positive input varying from a predetermined low voltage when said detected amplitude is less than or equal to said predetermined low level to a predetermined high voltage when said detected amplitude is greater than or equal to said predetermined high level, and means connecting said light emitting diode to said amplifier output.

3. An audio amplitude detector, as set forth in claim 2, wherein said reference voltage applying means includes means responsive to a linear increase in said amplifier output for linearly increasing said reference voltage from said predetermined low voltage to said predetermined high voltage.

4. An audio amplitude detector, as set forth in claim 2, and further including a second optical coupler having a second light emitting diode drive element and a second light responsive driven element, said second optical coupler having similar electrical properties to said optical coupler of said indirect coupling means, means connecting said second light emitting diode to said amplifier output, and wherein said reference voltage applying means includes said second light responsive driven element.

* * * * *